United States Patent [19]
Nakato et al.

[11] Patent Number: 5,486,424
[45] Date of Patent: Jan. 23, 1996

[54] SILYLATED PHOTORESIST LAYER AND PLANARIZING METHOD

[75] Inventors: Tatsuo Nakato, Vancouver; David A. Vidusek, Camas, both of Wash.

[73] Assignee: Sharp Kabushiki Kaisha, Osaka, Japan

[21] Appl. No.: 191,701

[22] Filed: Feb. 4, 1994

Related U.S. Application Data

[63] Continuation of Ser. No. 893,702, Jun. 5, 1992, abandoned.
[51] Int. Cl.⁶ .................................................. B32B 13/12
[52] U.S. Cl. .......................... 428/451; 428/447; 428/409; 430/272
[58] Field of Search ........................... 430/272; 428/451, 428/447, 409

[56] References Cited

U.S. PATENT DOCUMENTS

| | | | |
|---|---|---|---|
| 4,414,059 | 11/1983 | Blum et al. | |
| 4,568,632 | 2/1986 | Blum et al. | |
| 4,745,018 | 5/1988 | Chihara et al. | |
| 4,882,008 | 11/1989 | Gorzo et al. | 156/643 |
| 4,957,588 | 9/1990 | Koshiba et al. | 156/628 |
| 4,963,463 | 10/1990 | Koshiba et al. | 430/191 |
| 5,024,896 | 6/1991 | Mathad et al. | 430/312 |
| 5,108,875 | 4/1992 | Thackeray et al. | 430/326 |

OTHER PUBLICATIONS

*General Chemistry*, Brady et al., Third Edition, John Wiley and Sons, p. 17 (1982).
*Physical Chemistry*, Bromberg, Second Edition, Allyn and Bacon, Inc., p. 225 (1984).
*Grant and Hackh's Chemical Dictionary*, R. Grant et al., Fifth Edition, McGraw–Hill, Inc., pp. 541–542 (1987).
"Positive resist image by dry etching: New dry developing positive working system for electron beam and deep ultraviolet lithography", J. Vac. Sci. Technol. B7(6) Nov./Dec. 1989 C. Pierrat et al., pp. 1782–1786.

*Primary Examiner*—Christopher D. Rodee
*Attorney, Agent, or Firm*—Fliesler, Dubb, Meyer & Lovejoy

[57] ABSTRACT

A planarizing technique comprising: coating a topography overlying a substrate with a planarizing resist layer; softbaking the planarizing resist layer in the presence of a silicon-containing vapor or liquid; coating the planarizing resist layer with an imaging resist layer; softbaking the imaging resist; selectively exposing the imaging resist layer to light; developing the imaging resist layer; and etching the planarizing layer. The planarizing layer may comprise novolacs and other organic polymers used conventionally in lithographic processes. Specifically, the polymer is selected from the group consisting of a novolac, polymethylmethacrylate, polydimethylglutarimide and polyhydroxystyrene. The planarizing layer may further comprise any organic acid moiety that is compatible with the solvent used to dissolve the resin. In particular, the acid moiety is indole-3-carboxylic acid. In another aspect, the invention comprises a silylated planarizing resist. The resist comprises: a solution of a polymer and an acid, the polymer being selected from the group consisting of a novolac, polymethylmethacrylate, polyhydroxystyrene and polydimethylglutarimide and the acid concentration being homogeneous with respect to a horizontal surface of a substrate to which the solution is applied; and a silicon-rich layer, the layer being formed above the solution by the reaction of an organosilane with the acid.

11 Claims, 5 Drawing Sheets

FIGURE 2
PRIOR ART
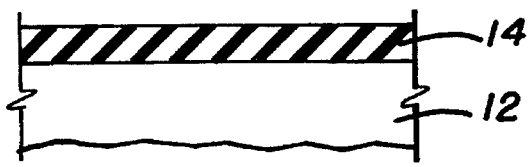
*FIG. 2A*
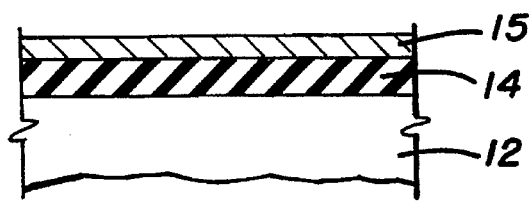
*FIG. 2B*
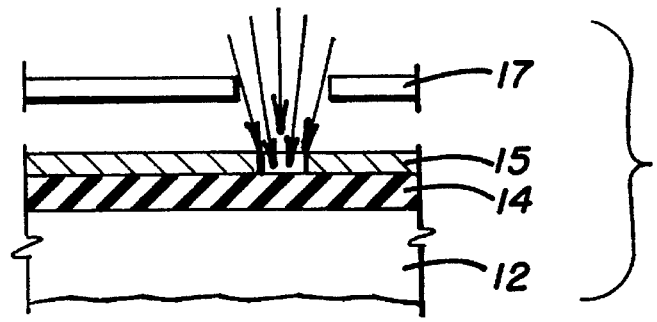
*FIG. 2C*
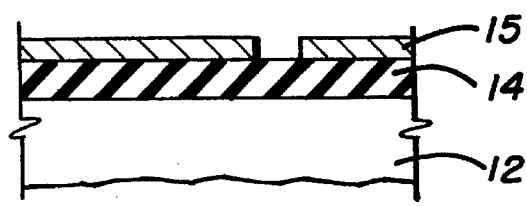
*FIG. 2D*
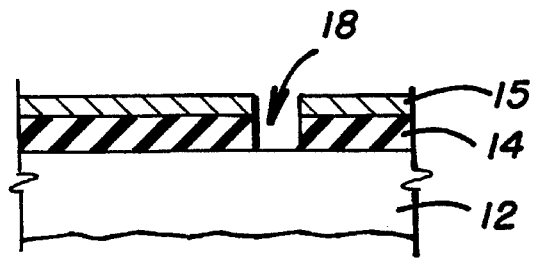
*FIG. 2E*
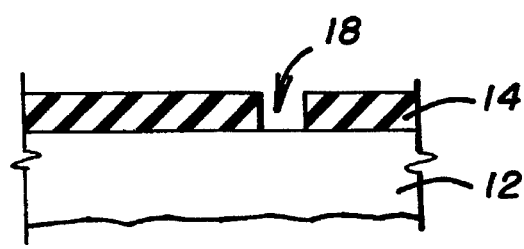
*FIG. 2F*

FIGURE 3
PRIOR ART
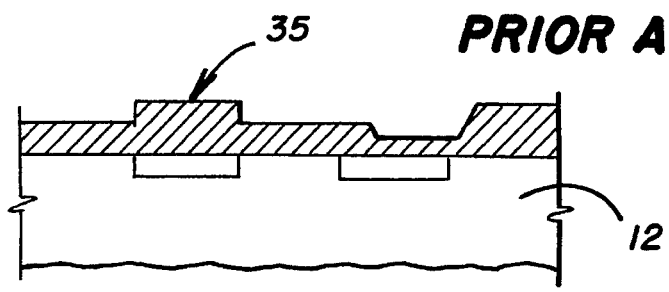
FIG. 3A
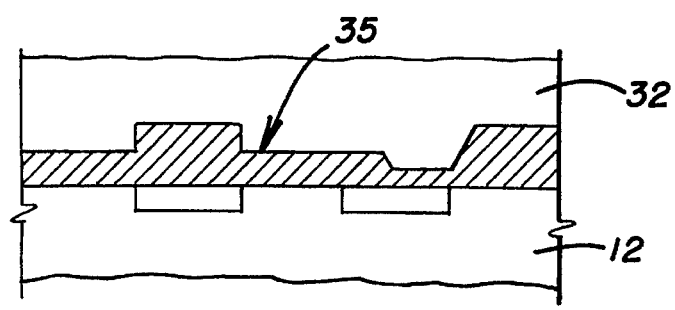
FIG. 3B
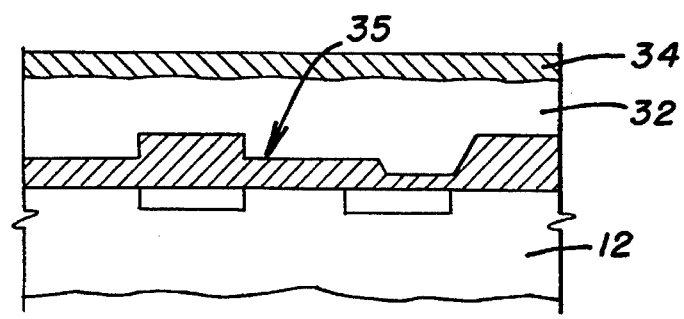
FIG. 3C
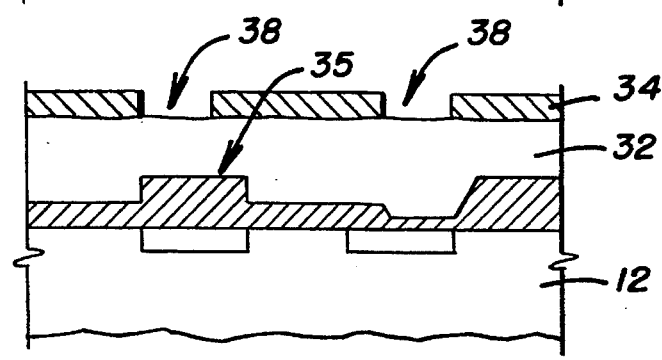
FIG. 3D
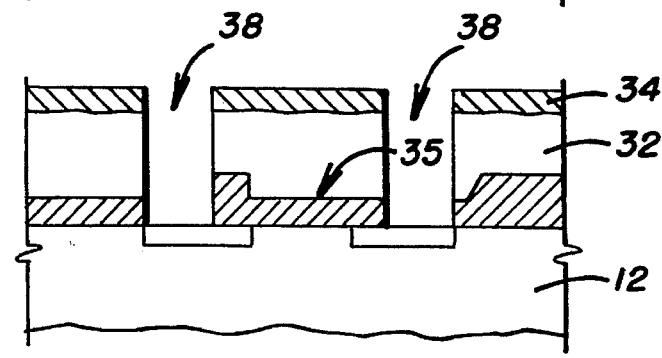
FIG. 3E

FIGURE 4
PRIOR ART
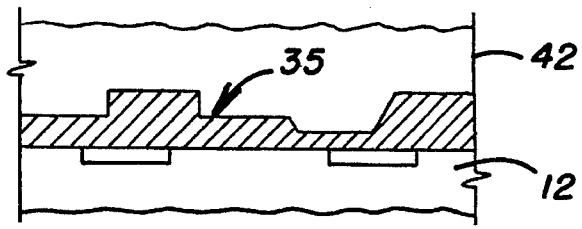
FIG. 4A
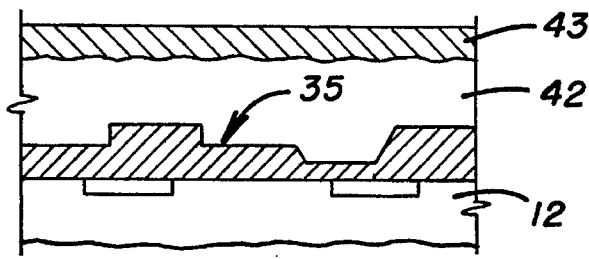
FIG. 4B
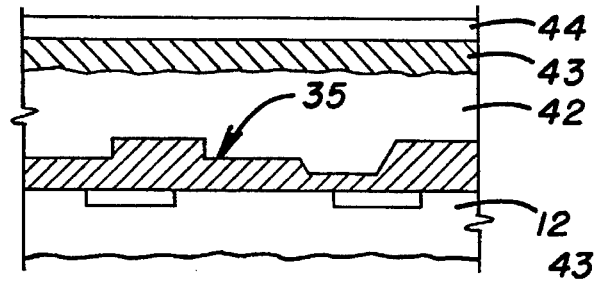
FIG. 4C
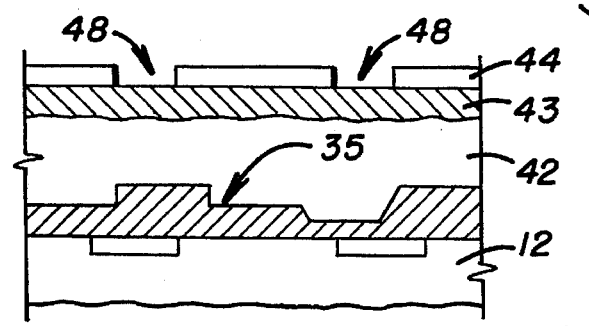
FIG. 4D
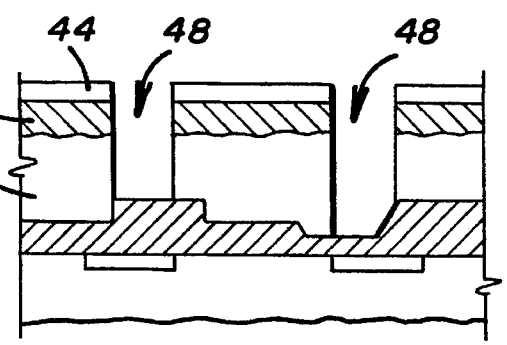
FIG. 4F
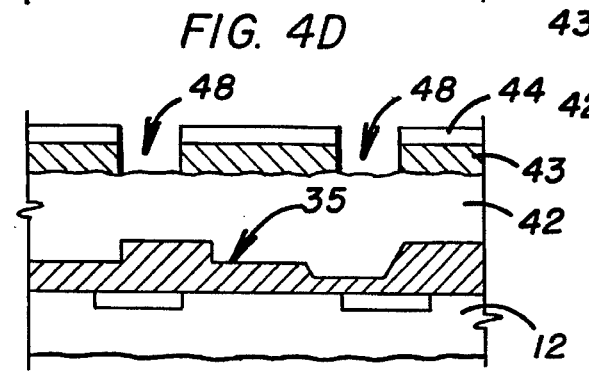
FIG 4E
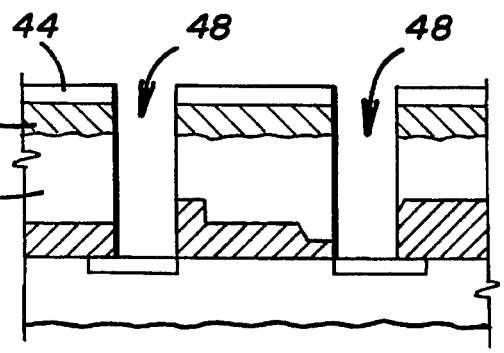
FIG. 4G

FIGURE 5
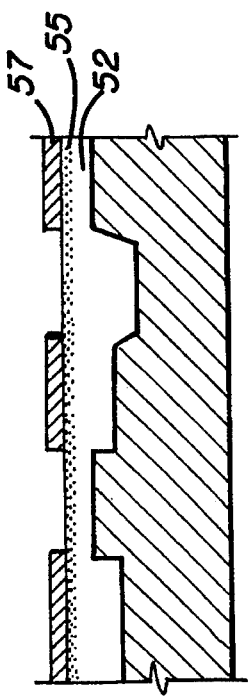
FIG. 5A
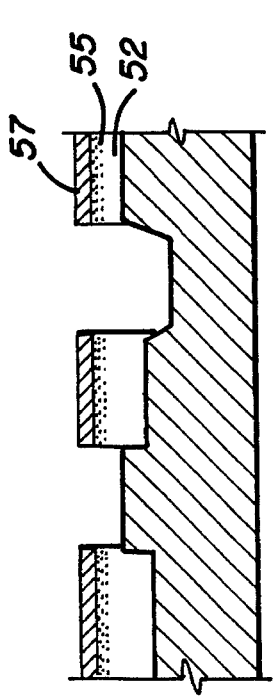
FIG. 5B
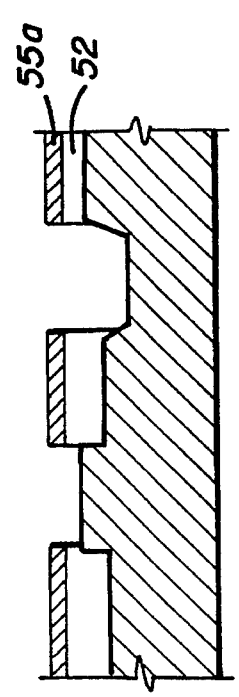
FIG. 5C
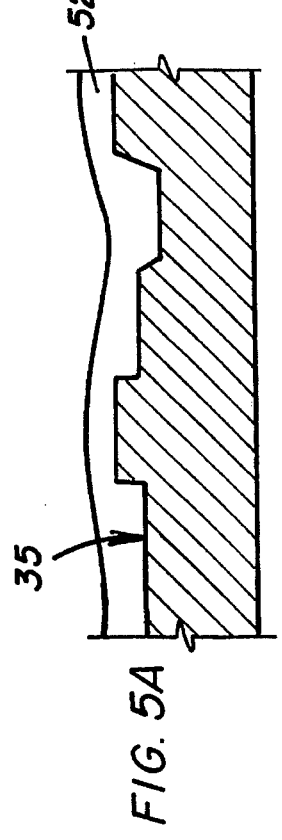
FIG. 5D
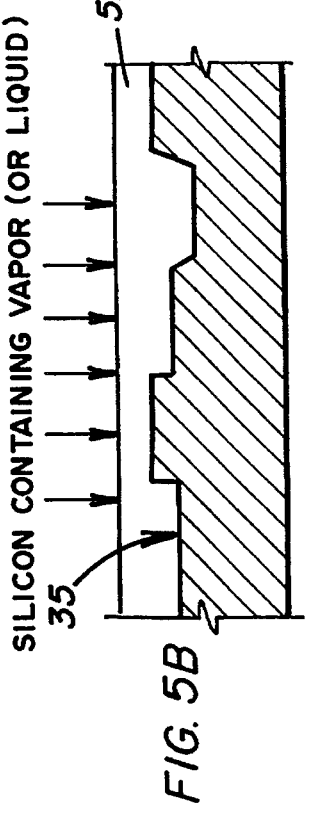
FIG. 5E
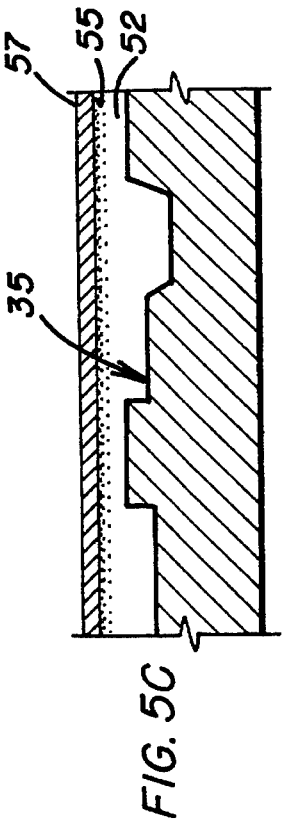
FIG. 5F

SILYLATED PHOTORESIST LAYER AND PLANARIZING METHOD

This application is a continuation of Ser. No. 07/893,702, filed Jun. 5, 1992, now abandoned.

BACKGROUND OF THE INVENTION

1. Field of the Invention

The invention relates to planarizing techniques for the manufacture of integrated circuits.

2. Description of the Related Art

In a typical integrated circuit device, numerous electronic circuits are fabricated on individual silicon substrates, with the components of individual active devices on the circuit separated by layers of insulation and interconnected by conductive layers. A typical transistor utilized in an integrated circuit device is shown in FIG. 1. Briefly, transistor 10 is manufactured by first providing a silicon substrate 12, shown in FIG. 1 as a P-type substrate, on which insulation layers 14 are grown. Insulation layer 14 may be composed of silicon oxide which is grown by conventional oxidation techniques. Insulation layer 14 is grown to cover the entire surface of substrate 12 and is thereafter patterned to provide the requisite schematic structure of the circuit desired.

As shown in FIG. 2, such patterning usually involves: placing a photosensitive layer or "photoresist" layer 15 over insulation layer 14; placing a preformed mask 17 over the photoresist layer 15; exposing the photoresist layer 15 to a light source; developing the photoresist layer to remove those portions of the layer which have been exposed to the light source (or those portions not exposed, depending on the type of photoresist used); and finally etching insulating layer 14 to form through-holes 18 therein. The structure is then doped to provide n-type impurities through openings 18 to substrate 12 forming the source and drain regions 16 for transistor 10. Subsequently, interconnect layers 20, generally formed of a metal or metal alloy, are deposited on the structure to couple the various components of transistor 10 to other components of the integrated circuit. The resulting upper surfaces 30 of transistor 10, and other transistors formed on the substrate define the topography.

Complex integrated circuits, manufactured to include highly dense concentrations of electronic components, require that additional photolithographic masking resist layers be applied to the surface of insulating layer 14. Generally, such additional layers are required to compensate for physical and chemical limitations of masking materials and lithography equipment available. The advancement of circuit schematics to the Very Large Scale Integration (VLSI) levels (between 100,000–1,000,000 components per chip) has required the addition of even more layers to the wafer surface. These additional masking layers have in turn required more production steps involving the wafer surface, making the resolution of small image sizes more difficult due to light reflection and the thinning of resist layers over the steps.

In the development of such high density manufacturing processes, creating and preserving distinctions in device topography in the latter stages of the device manufacturing process has been the main problem of integrated circuit lithographers. Surface topography presents an image definition problem when the mask image is to be exposed to the structural substrate. For example, contrast effects, photoresist light scattering, and substrate reflectivity all contribute to distortions in the pattern transmitted to the substrate surface during the photolithographic step. These factors have contributed to the dilemma for printing submicron device geometries having a narrow depth of focus (on the order of 0.1 µm).

The general solution to these problems, including the techniques of multilayer resist processing, planarizing layers and reflow, are referred to as "planarizing techniques". Their objective is to achieve a suitable flat surface to allow for the best image definition by the projection lens on the exposed structure.

One solution to this problem, generally referred to as a bi-layer planarizing technique and shown in FIGS. 3A–3E, utilizes two layers of photoresist to resolve small geometries on wafers with varied topographies. Typically, the two organic layers used—the bottom or "planarizing" layer 32 and a top, imaging resist definition layer 34—have different chemistries. A substrate surface 12, having a particular device topography 35 formed thereon, is shown in FIG. 3A. First, as shown in FIG. 3B, a relatively thick layer of resist 32—typically about 1.5 to 4 times the highest step height on the wafer, depending on the resist—is applied and baked to its thermal flow point. Suitable resists for such applications generally are sensitive to deep ultraviolet radiation and include positive-acting polymethylmethacrylate (PMMA). Subsequently, as shown in FIG. 3C, a thin layer of photoresist, sensitive to only near ultraviolet radiation is spun on top of the bottom layer 32 and processed through the development step of the production process (FIG. 3D). In this manner, the photoresist acts as a mask for the underlying planarizing layer. As discussed above, assuming layer 34 is a positive photoresist, the development steps comprise exposing layer 34 through a mask with ultraviolet radiation to transfer the mask pattern to layer 34 and then developing layer 34 to form holes 38 in the thin or "conformal" layer 34 (FIG. 3D). Conformal layer 34 allows transfer of the mask pattern to the wafer surface without such effects as reflections seen in thick wafer surfaces. Layer 32 is then provided with deep ultraviolet radiation exposure through the now-formed holes 38, transferring the pattern directly to the wafer surface. A second development step completes hole resolution, and the wafer is ready for etch. The wafer is thereafter etched, and the pattern provided through to the wafer surface (FIG. 3E).

Unfortunately, many of the planarizing film compositions, such as PMMA or polyimides, must be sufficiently different from the imaging resist to avoid interfacial mixing. Further, imaging through the planarizing layer requires a wavelength different from that for the imaging definition layer. These factors conspire to limit the planarizing compositions to materials that are much more difficult to process than conventional resist systems. Due to their associated high defect levels and processing complexity, bi-layer systems are used only for limited low volume applications.

Limitations in the bi-layer process have led to developments in tri-layer techniques, with materials that were already familiar to the IC manufacturing process. Tri-layer resist processes incorporate a "hard" layer between the two resist layers of the bi-layer process. This hard layer may be a deposited layer of silicon dioxide or other developer-resistant material. In a typical tri-layer process, shown in FIGS. 4A–4F, the first resist layer 42 is applied relatively thickly over the wafer topography, and heated or 'baked' to cause a slight flow. Subsequently, the "hard" layer 43 is deposited (FIG. 4B) and a thin top layer of resist 44 is applied (FIG. 4C). The pattern image is formed in the top photoresist layer 44 (FIG. 4D), and subsequently etched via holes 48 in the hard layer 43 (FIG. 4E). The first resist layer 42 (FIG. 4F) and the surface topography are then etched to form the requisite pattern in the device topography (FIG. 4G).

A typical hard planarizing layer used is a spin-on-glass (SOG) layer, the "glass" being a mixture of silicon dioxide in a solvent that evaporates quickly. After spin application, the glass film is heated to leave a planarized, silicon dioxide film.

While the tri-layer techniques, and specifically the SOG process, eliminated many of the shortcomings of the bi-layer technique, use of the SOG layer is fraught with its own complications. For example, the relatively rapid evaporation of the isopropyl alcohol solvent (IPA) can reduce the stability and shelf-life of the silicon dioxide-IPA mixture.

An especially significant problem relates to the SOG defect density. In particular, the SOG process is susceptible to internal and surface defects in the layer caused by particulate formation and deposition, since IPA dries very quickly compared with other solvents. One method by which particulate formation commonly occurs is the agglomeration of silicon dioxide into particles in the silicon dioxide-IPA mixture itself. The agglomeration results from the existence of the SOG system as a sol-gel, as opposed to a true solution. Another method of particulate formation occurs during the spin application procedure. During application, IPA evaporates rapidly from the mixture upon exposure to air at the tips of the dispense lines that overlie a substrate upon which the integrated circuit devices are to be formed. Particles may thereby encrust the tips. As a result of either method of formation, particles may be deposited as part of the SOG layer. Further, the added complexity of a tri-layer coating process increases the defect density level of SOG layers. However, the tri-layer technique improves over the bi-layer methodology due to the ease of processing the SOG and planarizing layers with a single step through the etching process and with high fidelity.

Another approach to simplify planarizing techniques involves the incorporation of silicon into selected areas of the conventional photoresist. For example, U.S. Pat. No. 4,882,008 relates to a single layer resist process in which the photoresist is processed, e.g., exposed to radiation, and then exposed to a gaseous silicon-containing species such as hexamethyldisilazane. Silicon is thereby incorporated into the exposed regions of the resist. The silicon-enriched resist is then exposed to an oxygen plasma by which the silicon is converted to silicon dioxide.

U.S. Pat. No. 4,963,463 describes a photoresist resin composition based on a radiation-sensitive resin and a photoactive compound that generates an acid upon radiation exposure. The radiation-sensitive resin may be based on a condensate of an alkali-soluble resin such as a novolac with a quinonediazide compound. A substrate coated with the photoresist resin composition is exposed to the appropriate radiation upon which an acid is formed. Thereafter, the coated substrate is treated with a silicon-containing compound, following which silicon is incorporated into the resist layer by reaction with the acid.

Several problems are encountered with some silylated planarizing resists relating to the ability to produce a desired pattern on a substrate. One problem relates to acid generation from a photosensitive precursor. Conversion of such a precursor, for example, by irradiation, can create acid concentration gradients across the planarizing resist layer, particularly at the transitions between positive and negative areas in the resist layer of the irradiated resist. Since uniform patterning in general and formation of uniform and discrete line widths in particular depend on uniform acid concentration in such planarizing resist compositions, acid-generating compositions detract from the desired uniformity and control of the pattern transfer.

A second problem relates to the long-term stability of the resist composition. For certain compositions, e.g., those based on diazonaphthoquinone resists and sensitizers, the presence of even small amounts (e.g., less than 1 wt %) of acid can cause decomposition over time, reducing shelf-life.

Thus, an object of the invention is to provide a highly precise, multi-layer semiconductor manufacturing process having a simplified methodology. A further object of the invention is to simplify the well-known tri-layer processing techniques without sacrificing process resolution.

Another object of the invention is the provision of a process which is relatively free from defect generation in the photoresist materials.

An additional object of the present invention is to provide a stable planarizing resin composition that enhances line width uniformity and overall pattern sharpness.

SUMMARY OF THE INVENTION

These and other objects of the invention are provided, in one aspect, in a planarizing technique comprising: coating the topography overlying a substrate with a planarizing resist layer; softbaking the planarizing resist layer in the presence of a silicon-containing vapor or liquid; coating the planarizing resist layer with an imaging resist layer; softbaking the imaging resist; selectively exposing the imaging resist layer to radiation; developing the imaging resist layer; and etching the planarizing layer.

In a further aspect, the planarizing layer comprises an organic polymer conventionally used in lithographic processes, such as novolacs, polyimides and other organic polymers. Specifically, the polymer is selected from the group consisting of a novolac, polymethylmethacrylate, polydimethylglutarimide and polyhydroxystyrene. The planarizing layer may further comprise any organic acid moiety that is compatible with the solvent used to dissolve the resin. In particular, one acid moiety is indole-3-carboxylic acid.

In another aspect, the invention comprises a silylated planarizing resist. In particular, the resist comprises: a solution of a polymer and an acid, the polymer being selected from the group consisting of a novolac, polymethylmethacrylate, polyhydroxystyrene and polydimethylglutarimide and the acid concentration being homogeneous with respect to a horizontal surface of a substrate to which the solution is applied; and a silicon-rich layer, the layer being formed above the solution by the reaction of an organosilane with the acid.

In a further aspect, the acid concentration of the silylated planarizing resist is between about 5 to 40 wt % relative to the polymer. In particular, the acid concentration is between about 25 to 30 wt % relative to the polymer.

The invention represents a simplification of the tri-layer process utilizing the SOG layer technique, which allows for the use of conventional lithographic polymers in combination with a deviation of the silylation process currently employed in limited production IC manufacture. Briefly, the SOG process is replaced with a simple silylation step, capable of being performed with conventional equipment. The simplification results from the reduction of the process from the application of three coated layers, and elimination of the defect-prone SOG material, to create a process utilizing two conventional organic resist layers. Following the coating and silylation steps, processing of the bi-layer photoresist sandwich is identical to that of the tri-layer SOG sandwich, with pattern imaging and wet development of the definition layer.

BRIEF DESCRIPTION OF THE DRAWINGS

The invention will be described with respect to the particular embodiments thereof. Other objects, features, and advantages of the invention will become apparent with reference to the specification and drawings in which:

FIGS. 2A–2F are cross-sectional views of an exemplary photolithographic process in the prior art.

FIGS. 3A–3E are cross-sectional views of an exemplary prior art bi-layer planarizing technique.

FIGS. 4A–4G are cross-sectional views of an exemplary prior art tri-layer planarizing technique.

FIGS. 5A–5F are cross-sectional views of a planarizing method in accordance with the present invention.

DESCRIPTION OF THE PREFERRED EMBODIMENT

Figure 1:
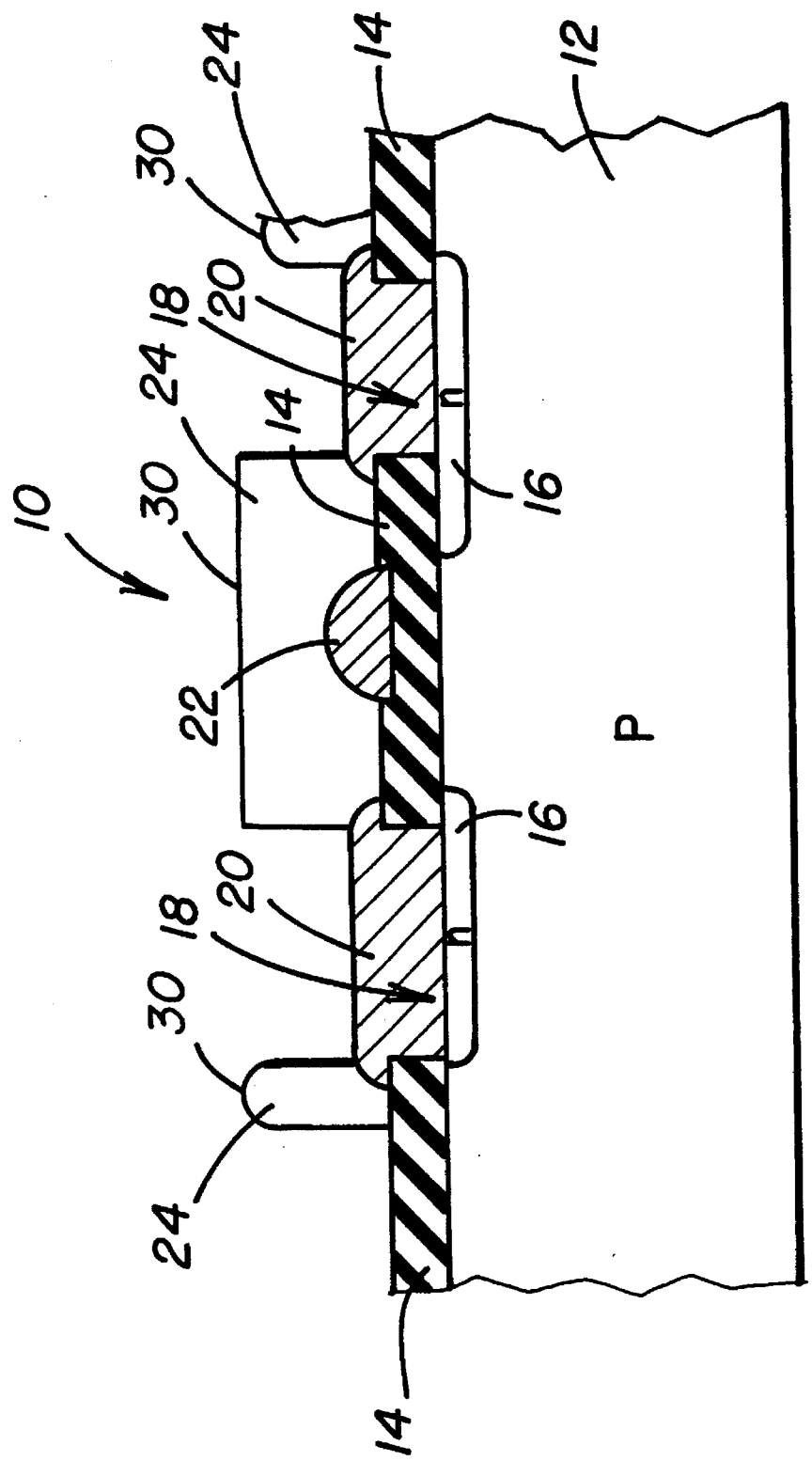
FIG. 1 is a cross-section of an exemplary transistor utilized in an integrated circuit device.

Referring to FIG. 4, it should be noted that the tri-layer planarizing process can be reduced to roughly ten process steps: (1) providing planarizing resist 42 on topography 35; (2) "soft-baking" planarizing resist 42; (3) coating planarizing resist 42 with SOG material 43; (4) baking and curing the SOG material 43; (5) coating the SOG material 43 with imaging resist 44; (6) soft-baking imaging resist 44; (7) exposing imaging resist 44 to an etch mask; (8) developing imaging resist 44; (9) etching SOG material 43; and (10) etching planarizing material 42.

With reference to FIG. 5, the unique process of the invention will be hereinafter described. The invention results in a process that utilizes only eight steps and reduces the amount of particulate matter generated during the planarizing process. Other advantages of the invention will become clear from the following description of the invention, and will be hereafter described.

Briefly, as shown in FIG. 5A, a planarizing resist material 52 is provided onto topography 35 overlying a substrate. As discussed in detail below, the planarizing resist material has a novel chemical make-up that supports use of the process of the invention.

As shown in FIG. 5B, planarizing resist 52 is thereafter softbaked in an appropriately heated environment and simultaneously silylated through introduction of a silylating agent in the form of a silicon-containing vapor or liquid. The softbake/silylation step results in the formation of a layer 55 of silicon-enriched photoresist at the upper portion of planarizing resist 52. The softbake/silylation step may be performed by inserting the substrate coated with planarizing resist 52 into a conventional vapor prime oven adapted to support a silicon-containing environment.

A conventional imaging layer 57 is thereafter spin-coated onto the planarizing resist 52, resulting in the structure shown at FIG. 5C. Subsequently, imaging resist 57 is softbaked and cured.

The thin (2000–4000Å) imaging resist 57 is thereafter exposed and developed (FIG. 5D) to remove selected pattern portions.

As shown in FIG. 5E, planarizing resist 52, including the silicon-rich portion 55, is then plasma etched down to topography 35, using imaging resist 57 as a mask. Generally, the first portion of this step is similar to a conventional silicon etch process and may be performed in a hydrofluorocarbon gas such as $CF_3H$ or $CF_4$. Once the silicon-rich layer is removed in the exposed portions, the chemistry of the etch process is changed to an oxidizing plasma, such as oxygen, yielding the structure shown in FIG. 5F. This oxidizing plasma etching step allows for utilization of the silicon-containing resist layer 55 as a mask since the oxidizing plasma removes the conventional imaging resist layer 57, and converts the silicon-containing layer 55 to $SiO_2$ (layer 55a in FIG. 5F), without etching through the substrate underlying the wafer topography 35. As a result, only eight process steps are utilized to achieve a planarizing process with resolution equaling that of tri-layer schemes and that generates far less particulate matter compared with conventional tri-layer, and specifically SOG layer, processes.

A significant feature of silylating planarizing resist 52 is its unusual chemical makeup. Unlike conventional silylating resists that contain a photoactive component that generates an appropriate acid to react with the silylating agent, the planarizing film composition of the present invention is not photosensitive. A suitable acid may be provided when the substrate is coated with the planarizing resist; that is, the acid is present in situ without destabilizing the resist composition. As a result, a uniform planarizing resist solution can be provided on the substrate.

In particular, the makeup of the planarizing resist can be any organic polymer used in lithographic processes, as are well known in the art, including conventional novolacs (or functionally similar polymers), polyimides, PMMA, polydimethylglutarimide (PMGI) or polyhydroxystyrene, alone or in combination with each other. A key consideration in the selection of the polymer is its glass transition temperature, $T_g$, since performing the planarizing process at temperatures above $T_g$ facilitates the diffusion of the acid toward the air interface of the resist. In particular, following the softbake and silylation steps, the acid concentration in a horizontal plane of the planarizing resist remains constant.

An additional advantage of the resist composition employed in the present invention is the dissolution of the polymer, acid and any sensitizers or other additives in solvents that are relatively less evaporative than IPA. Such solvents include ethyl lactate and propylene glycol monomethylether acetate (PGMEA). These solvents readily dissolve novolacs and other polymers suitable for use in connection with the present invention, further contributing to the reduction of defect density in the planarizing layer.

During the softbake step (FIG. 5B), the acid diffuses toward the interface of the planarizing film 52 with air. Upon introduction of the silylating agent, the silicon reacts with the acid moiety, forming a layer of silylated polymer at the interface of the planarizing film with the environment. Acceptable polymer flow upon heating during the softbake step, and therefore diffusion rates of the acid, is achieved with resins having $T_g$ between about 100° C. and 200° C., with $T_g$ between about 135° C. to about 145° C. being preferred.

Suitable organic acid moieties include members of the acid-functional family of indoles, such as indole-3-carboxylic acid. Other acids may be used depending on their molecular weight, volatility and solubility relative to the polymer used. About 5–40 wt % (acid to polymer) is effective, with 25–30 wt % being preferred.

Any organosilane such as HMDS, i.e., hexamethyldisilazane amine, may be used as a silylating agent during the softbake/silylation step, as is well known in the art. Either liquid or gaseous organosilanes may be used, although the latter are easier to filter than the former and therefore contribute to the reduction of particulate formation in the planarizing layer.

When a conventional vapor prime oven chamber such as the model available from Yield Enhancement Systems Company is used, the silicon-containing environment is generally gaseous. Utilization of such an oven permits direct control of the organosilane vapor pressure and therefore the amount and uniformity of silicon incorporation. For example, such control may be achieved in conjunction with a cylinder containing the silane in nitrogen gas. Sufficient silicon incorporation may be achieved after the substrate coated with a planarizing resist is exposed to the organosilane vapor for about 1 hour at 3 psi nitrogen and 170° C. Alternatively, a hot plate oven such as is available commercially from Silicon Valley Group of San Jose, Calif. may be used. The coated substrate may be exposed to the organosilane vapor for about 60 seconds at 170° C. and 3 psi nitrogen carrier. Alternatively, a "puddle" or "pool" of liquid organosilanes may be provided on the planarizing film.

With the bi-layer process of the present invention, the essence of the tri-layer process is essentially duplicated, as the thin silylated layer will be converted to silicon dioxide in the presence of an oxidizing plasma. The silylated crust on the planarizing resist may be processed and performs similarly to the SOG material in the conventional tri-layer process. Uniform acid concentration across the planarizing resist and use of a thin imaging resist layer to generate sharp positive and negative transitions of the pattern to be transferred contribute to the transfer of a desirably sharp pattern to the substrate.

Yet another feature of planarizing resist layer 52 is its absorption of deep ultraviolet radiation, generally at wavelengths between 180–280 nm. In the final stages of device manufacture, the topography of the chip becomes fairly significant. As a result, when metal layers are deposited onto the chip, the surfaces may no longer be perfectly planar and unwanted reflections may occur in the subsequent lithography steps. In the deep ultraviolet (180–280 nm), the resist layer absorbs the exposing wavelengths. This has the tendency to significantly reduce, if not eliminate, reflections during the exposure steps in the process. If exposure is desired at more conventionally used, longer wavelengths, for example in the range of 365–436 nm, a conventional dye, absorbing at the desired exposure wavelengths, may be mixed with the planarizing layer such that the layer becomes absorbing at the exposure wavelengths. Suitable dyes include any of a number of commercially available coumarin laser dyes, and equivalents. In the alternative, the organic acid may be chosen such that it can absorb at the exposing wavelengths.

The process of the present invention provides enhanced process capabilities using conventional organic resists. In addition, low defect density is achieved through improved resist composition, optimal coating of resist materials and the reduction of the steps involved in the planarizing process from three to two. Further, improved planarizing is achieved without resort to excessive processing conditions since conventional lithographic polymers with relatively low glass transition temperatures may be employed.

The many features and advantages of the present invention will become clear to those skilled in the art. All such modifications and variations are contemplated to be within the scope of the specification, drawings and the following claims.

We claim:

1. A silylated planarizing resist, the resist having a surface, comprising:
   (a) an organic polymer capable of use in lithographic processes; and
   b) an acid in a solution with the polymer, the solution forming a silicon-enriched portion adjacent to the surface of the resist,
   wherein the silicon-enriched portion is formed by reaction of an organosilane with the acid and wherein the resist is not photosensitive.

2. A silylated planarizing resist according to claim 1, wherein the acid is indole-3-carboxylic acid.

3. A silylated planarizing resist according to claim 2, wherein the concentration of acid is between about 5 to 40 wt % relative to the polymer.

4. A silylated planarizing resist according to claim 3, wherein the concentration of acid is between about 25 and 30 wt % relative to the polymer.

5. A silylated planarizing resist according to claim 1, wherein the organosilane is gaseous.

6. A silylated planarizing resist according to claim 1, wherein the organosilane is liquid.

7. A silylated planarizing resist according to claim 1, wherein the polymer is selected from the group consisting of a novolac, polymethylmethacrylate, polyhydroxystyrene and polydimethylglutarimide.

8. A silylated planarizing resist, the resist having a surface, comprising:
   a) an organic polymer capable of use in planarizing an irregular surface of a substrate and used in lithographic processes;
   b) an acid in a solution with the polymer, the solution forming a silicon-enriched portion adjacent to the surface of the resist,
   wherein the silicon-enriched portion is formed by reaction of an organosilane with the acid and wherein the resist is not photosensitive.

9. A silylated planarizing resist, the resist having a surface, comprising an organic polymer in solution with an acid, wherein the polymer has a glass transition temperature sufficient to facilitate diffusion of the acid toward an air interface of the solution and to facilitate polymer flow to planarize a surface of a substrate during softbake, wherein the solution forms a silicon-enriched portion adjacent to the surface of the resist, and wherein the silicon-enriched portion is formed by reaction of an organosilane with the acid and wherein the resist is not photosensitive.

10. A silylated planarizing resist according to claim 9, wherein the glass transition temperature is between about 100° C. and 200° C.

11. A silylated planarizing resist according to claim 10, wherein the glass transition temperature is between 135° C. and 145° C.

\* \* \* \* \*